United States Patent
Wang

(10) Patent No.: US 9,167,707 B1
(45) Date of Patent: Oct. 20, 2015

(54) ADJUSTABLE HOLDING DEVICE

(71) Applicant: SYNCMOLD ENTERPRISE CORP., New Taipei (TW)

(72) Inventor: Juei-Hsien Wang, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 14/488,297

(22) Filed: Sep. 17, 2014

(30) Foreign Application Priority Data

Aug. 12, 2014 (TW) .............................. 103214438 U

(51) Int. Cl.
*F16M 11/00* (2006.01)
*H05K 5/02* (2006.01)
*F16M 11/28* (2006.01)

(52) U.S. Cl.
CPC .............. *H05K 5/0204* (2013.01); *F16M 11/28* (2013.01)

(58) Field of Classification Search
CPC ..... H05K 5/0204; F16M 11/28; F16M 11/26; F16M 11/24; F16M 11/18; F16M 11/046; F16M 2200/08; Y10S 248/92; Y10S 248/917; Y10S 248/919
See application file for complete search history.

(56) References Cited

U.S. PATENT DOCUMENTS

| | | | | |
|---|---|---|---|---|
| 7,874,530 | B2 * | 1/2011 | Kim et al. | 248/176.1 |
| 8,313,074 | B2 * | 11/2012 | Wang | 248/295.11 |
| 2004/0118984 | A1 * | 6/2004 | Kim et al. | 248/149 |
| 2006/0011788 | A1 * | 1/2006 | Jang | 248/132 |
| 2007/0045494 | A1 * | 3/2007 | Teng | 248/300 |
| 2007/0102600 | A1 * | 5/2007 | Ishizaki et al. | 248/176.3 |
| 2008/0006744 | A1 * | 1/2008 | Sun | 248/161 |
| 2014/0284435 | A1 * | 9/2014 | Lu et al. | 248/125.2 |

* cited by examiner

*Primary Examiner* — Brian D Mattei
(74) *Attorney, Agent, or Firm* — Muncy, Geissler, Olds & Lowe, P.C.

(57) ABSTRACT

A holding mechanism includes a stand, a frame, a first mechanism and a second mechanism. The frame is slidably disposed on the stand and has an engaging portion. The first mechanism is installed on a side of the stand and provides the frame with a first force. The second mechanism is installed on another side of the stand and opposite to the first mechanism, and the second mechanism is capable of switching between an engaging status and a released status. The second mechanism engages with the first mechanism as being in the engaging status, so as to be connected to the frame and provide the frame with a second force. The second mechanism separates from the first mechanism as being in the released status, so as not to be connected to the frame and not provide the frame with the second force.

10 Claims, 10 Drawing Sheets

ADJUSTABLE HOLDING DEVICE

BACKGROUND OF THE INVENTION

1. Field of the Invention

The present invention relates to a holding device, and more particularly, to a thin holding device for holding electronic devices with different weights.

2. Description of the Prior Art

Please refer to FIG. 1. FIG. 1 is an exploded diagram of a holding device 9 in the prior art. As shown in FIG. 1, the holding device 9 includes a stand 91, a sliding frame 92, a plurality of constant force springs 93 and a plurality of linkage members 94 corresponding to the constant force springs 93. The stand 91 is placed on a working surface. The sliding frame 92 is slidably disposed on the stand 91. An end of each of the constant force springs 93 is fixed on the stand 91. Each of the linkage members 94 is selectively connected to the sliding frame 92 and the corresponding constant force spring 93, so as to establish a linking status. In the linking status, when the sliding frame 92 slides relative to the stand 91, the sliding frame 92 activates the linkage member 94 to slide, such that the corresponding constant force spring 93 generates a recovering force for making the sliding frame 92 stop at any desired position.

However, as shown in FIG. 1, the plurality of constant force springs 93 and the plurality of linkage members 94 are all disposed and arranged on the same side of the stand 91. Accordingly, a specific volume on the side of the stand 91 is required for providing the constant force springs 93 and the linkage members 94 with the mechanical space for installation. As a result, the aforesaid mechanism constrains the volume of the holding device 9 and disadvantages development of the holding device 9 with thin thickness.

SUMMARY OF THE INVENTION

Thus, the present invention provides a thin holding device for holding electronic devices with different weights for solving the above drawbacks.

According to the claimed invention, an adjustable holding device includes a stand, a frame, a first mechanism and a second mechanism. The frame is disposed on the stand and capable of reciprocatingly sliding relative to the stand. The frame has an engaging portion. The first mechanism is installed on a side of the stand, and the first mechanism includes a first resilient member which is connected to the frame and provides the frame with a first force. The second mechanism is installed on another side of the stand and opposite to the first mechanism. The second mechanism is switchable between an engaging status and a released status, and includes a second resilient member and an engaging member. The engaging member is connected to the second resilient member. When the second mechanism is in the engaging status and engages with the engaging portion, the second resilient member is connected to the frame and for providing the frame with a second force. When the second mechanism is in the released status and separates from the engaging portion, the second resilient member is not connected to the frame and does not provide the frame with the second force, wherein a direction of the first force is opposite to a direction of the second force.

According to the claimed invention, the second resilient member is a constant force spring, the frame is capable of sliding relative to the stand between a high position and a low position, and the second mechanism further includes a housing member slidably installed on the stand. The second resilient member is disposed inside the housing member. The housing member is adapted for activating the engaging member to selectively engage with the engaging portion when the frame slides to the low position.

According to the claimed invention, the holding device further includes a latch mechanism installed disposed on the stand and near the second mechanism. The latch mechanism latches the housing member when the second mechanism is in the released status.

According to the claimed invention, the latch mechanism includes a latching member and a driving member. The latching member is movably installed on the stand. The driving member abuts against the latching member and the stand. The driving member drives the latching member to latch the housing member when the second mechanism is in the released status.

According to the claimed invention, the housing member has a first latching portion, and the latching member has a second latching portion. The second latching portion is for latching the first latching portion, such that the latching member latches the housing member. The frame further has a pushing portion. The pushing portion is for pushing the latching member when the frame moves to the low position, so as to separate the second latching portion from the first latching portion.

According to the claimed invention, the housing member has a button portion, and a through hole corresponding to the button portion is formed on the stand. The button portion is slidably disposed within the through hole and protrudes from an opposite side of the stand relative to the housing member.

According to the claimed invention, a direction in which the button portion slides is inclined with a direction in which the frame reciprocatingly slides relative to the stand.

According to the claimed invention, the holding device further includes a sliding mechanism for sliding the frame relative to the stand. The sliding mechanism has an outer track and an inner track. The outer track is fixed on the stand. The inner track is installed on the frame and cooperates with the outer track slidably.

According to the claimed invention, the first mechanism further includes a roller member rotably disposed on the stand. The first resilient member is a constant force spring and sleeves on the wheel member.

According to the claimed invention, the stand includes a plate, and the roller member includes a rolling body and a shaft. The shaft protrudes from the rolling body and is pivoted to the stand. The shaft is substantially parallel to a normal of the plate.

In summary, the two mechanisms (the constant force spring) of the present invention are disposed on the two opposite sides of the stand and are able to provide the frame with forces applied in opposite directions. The frame of the present invention is able to be selectively connected to the mechanism (the constant force spring) with smaller force. When the holding device is for holding the electronic device with more weight, the frame is not connected to the mechanism with smaller force. As a result, the mechanism (the constant force spring) with larger force is capable of providing enough force for lifting the electronic device with more weight. On the other hand, when the holding device is for holding the electronic device with less weight, the frame is connected to the mechanism with smaller force. The force provided by the mechanism with smaller force is opposite to the force provided by the mechanism with larger force. As a result, the force provided by the mechanism with smaller force eliminates part of the force provided by the mechanism with larger force. In such a manner, the holding device is capable of lifting the electronic device with less weight. In addition, the two mechanisms of the present invention are disposed on the two opposite sides of the stand for reducing an amount of component on one single side. It reduces overall thickness of the holding device and advantages development of the holding device with thin thickness.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
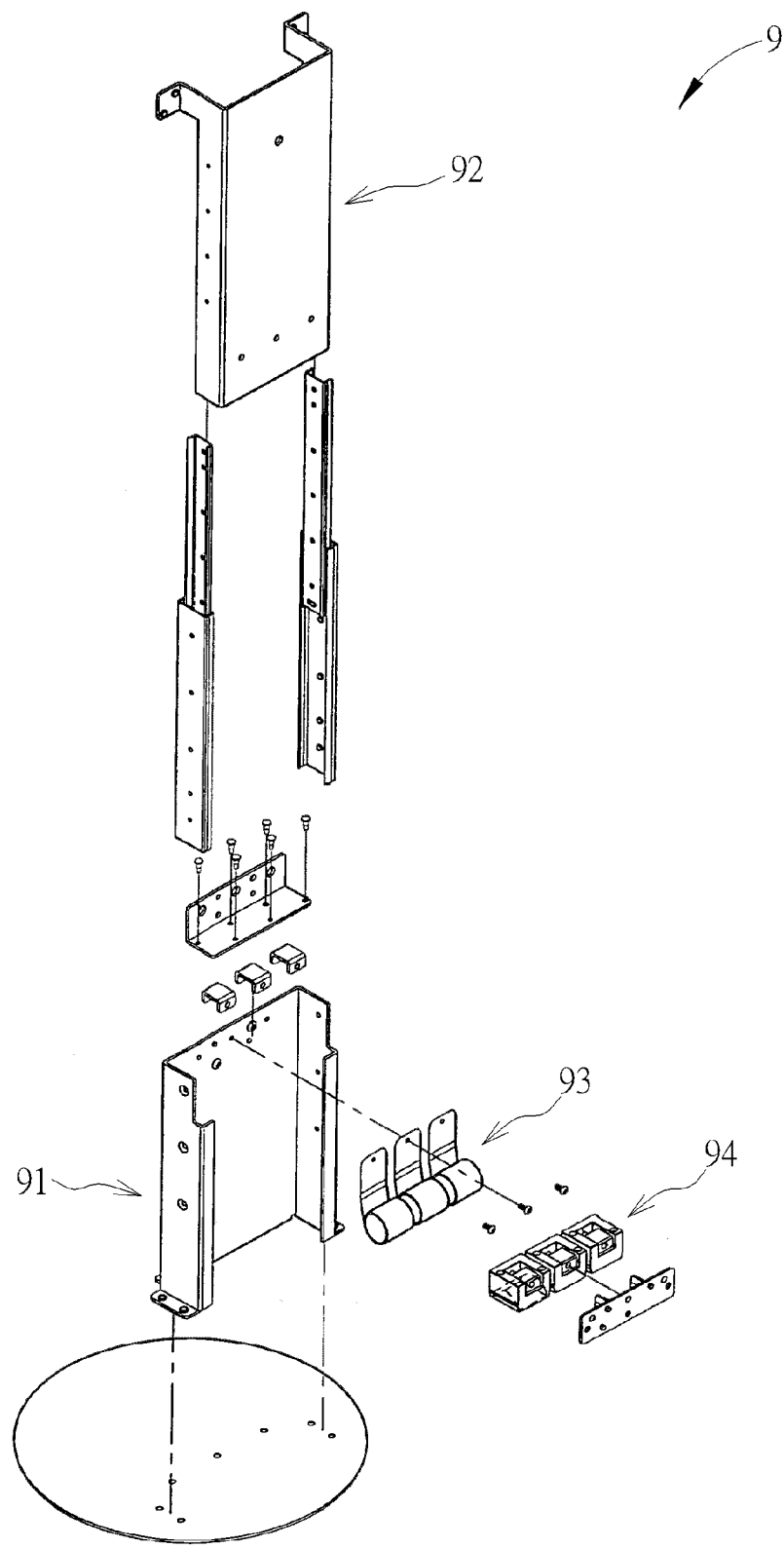
FIG. 1 is an exploded diagram of a holding device in the prior art.
Figure 2:
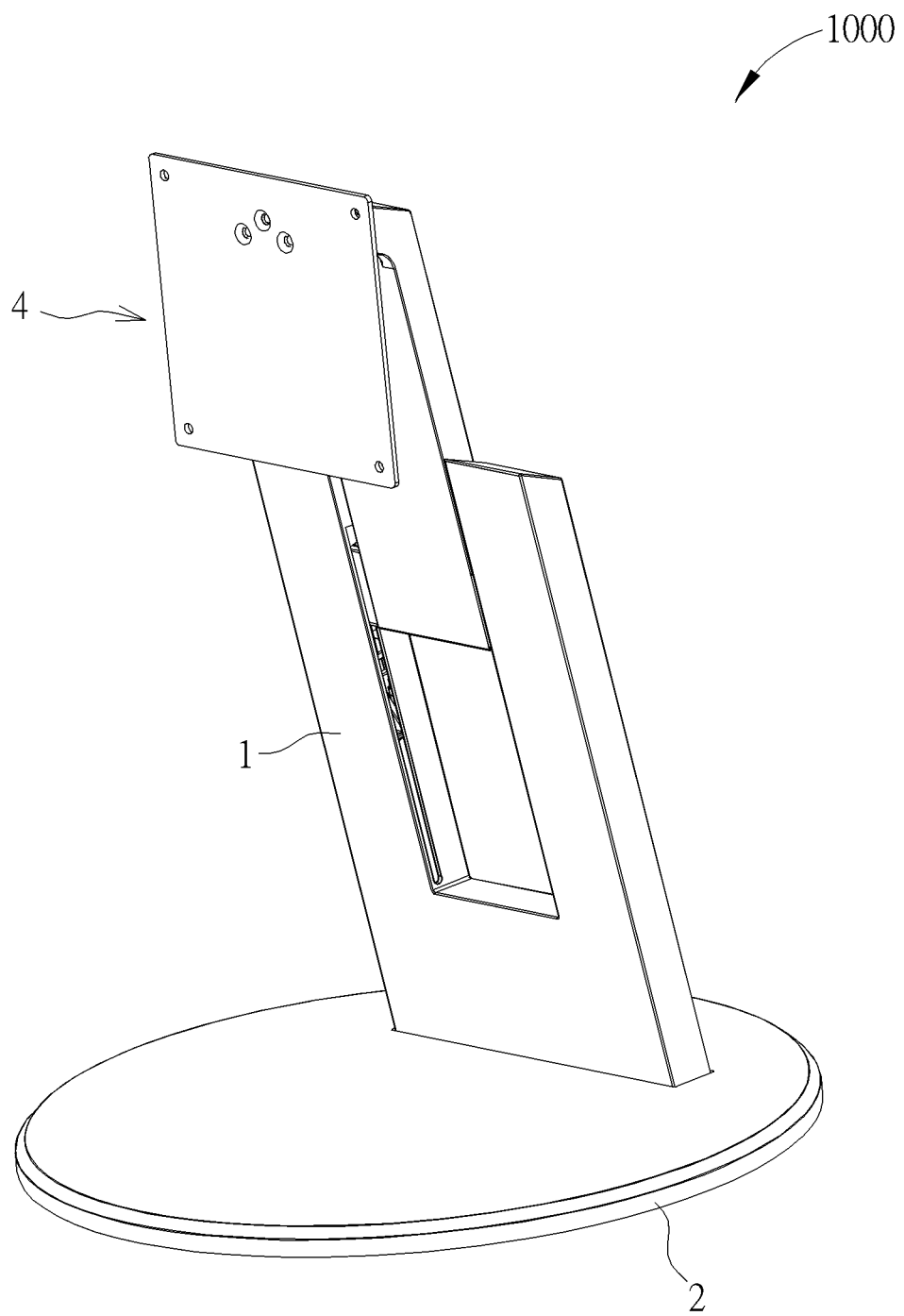
FIG. 2 is a schematic diagram of a holding device according to an embodiment of the present invention.
Figure 3:
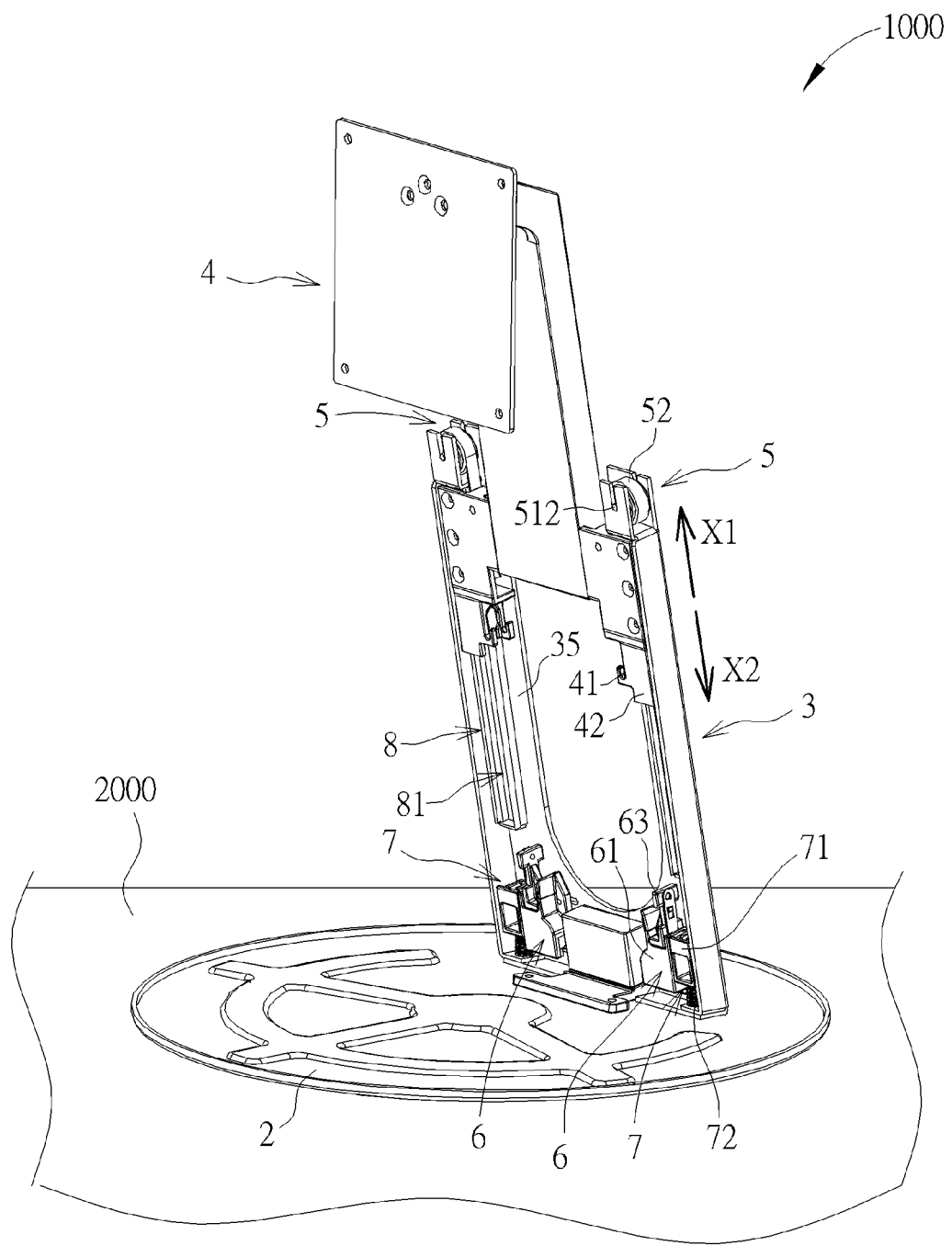
FIG. 3 is an internal diagram of the holding device according to the embodiment of the present invention.
Figure 4:
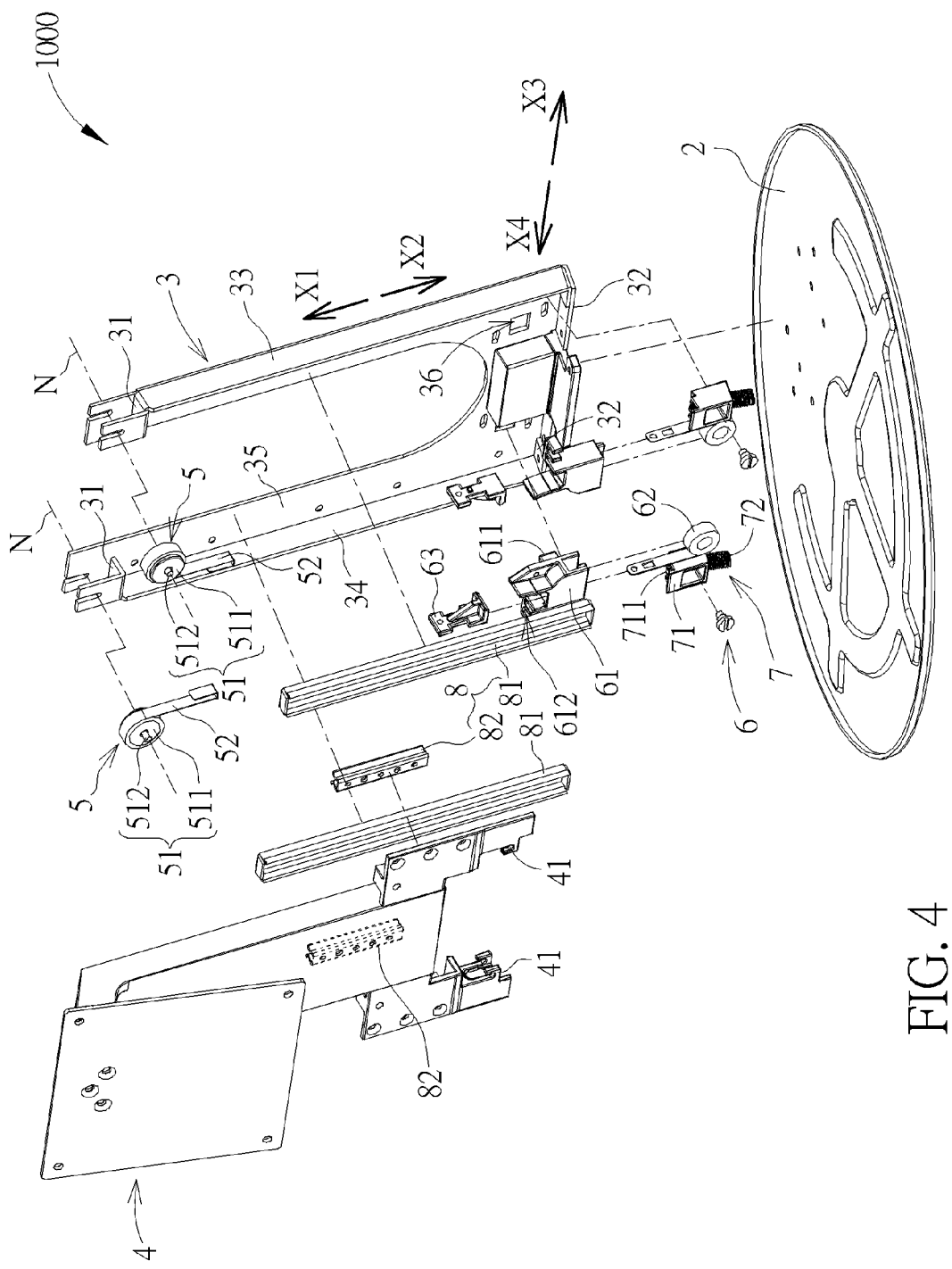
FIG. 4 is an exploded internal diagram of the holding device according to the embodiment of the present invention.
Figure 5:
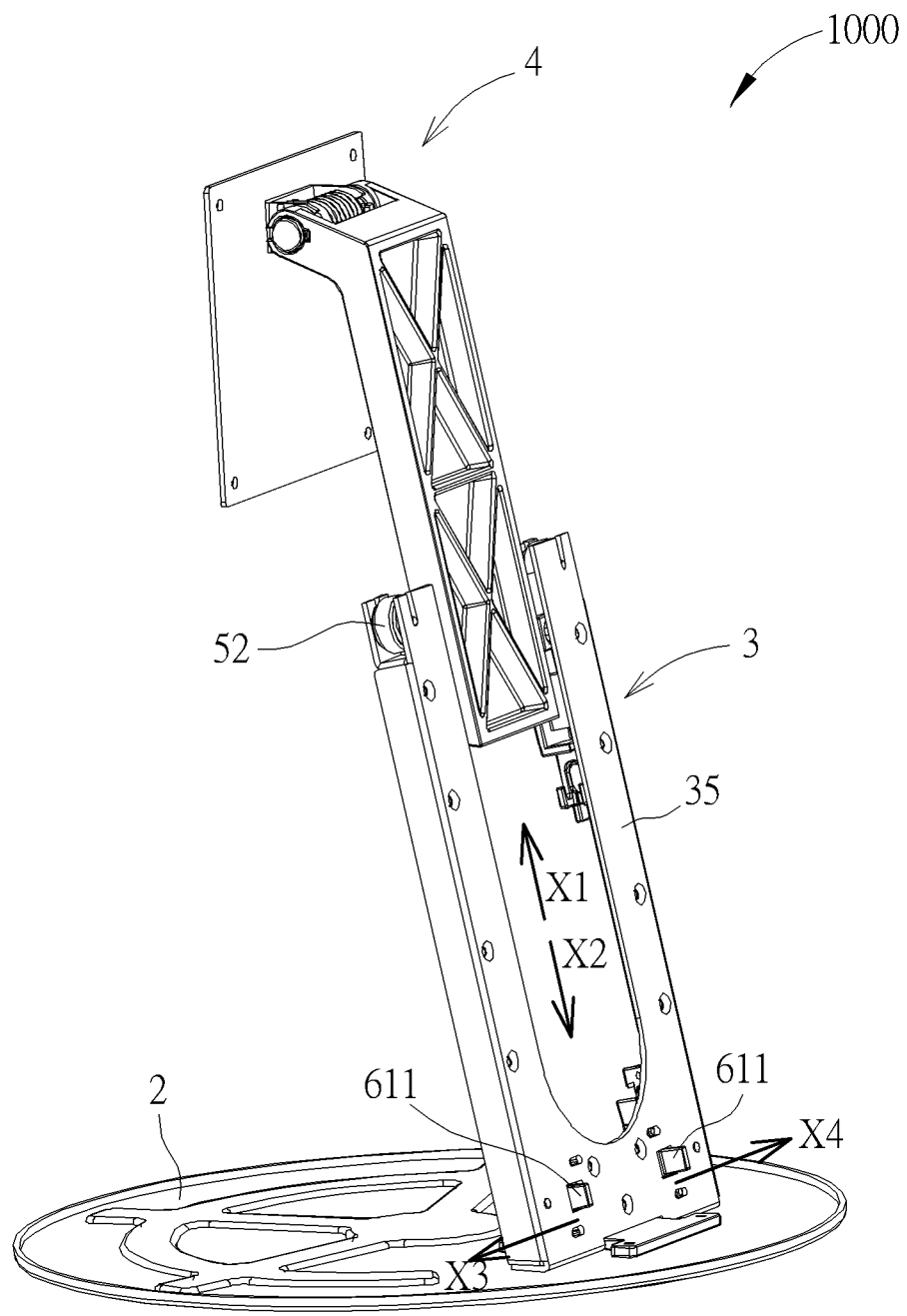
FIG. 5 is an internal diagram of the holding device in another view according to the embodiment of the present invention.

As shown in FIG. 2, a holding device 1000 includes a casing 1 for providing covering function. As shown in FIG. 3 to FIG. 5, the holding device 1000 further includes a stand 3, a frame 4, two first mechanisms 5, two second mechanisms 6, two latch mechanisms 7, a sliding mechanism 8 and a base 2. The base 2, which the stand 3 is disposed on, is used for supporting the stand 3 on a supporting surface 2000. In practical application, the supporting surface 2000 is a desktop, but the present invention is not limited thereto.

As shown in FIG. 3 to FIG. 5, the frame 4 is disposed on the sliding mechanism 8 and slidable relative to the stand 3. Furthermore, the sliding mechanism 8 includes two outer tracks 81 and two inner tracks 82. The stand 3 has a first side 31, a second side 32, a third side 33 and a fourth side 34. The first side 31 is opposite to the second side 32. The third side 33 is opposite to the fourth side 34 and adjacent to the first side 31 and the second side 32. The two outer tracks 81 are respectively fixed on the stand 3 near the third side 33 and the fourth side 34. The two inner tracks 82 are installed on two sides of the frame 4 corresponding to the outer tracks 81. Each of the inner tracks 82 is used for cooperating with the corresponding outer track 81 in a slidable manner, so as to slide the frame 4 relative to the stand 3.

In this embodiment, the stand 3 includes a plate 35. Each of the outer tracks 81 is oriented on the stand 3 parallelly to a first direction X1, as shown in FIG. 4. In such a manner, when the inner tracks 82 are disposed inside the outer tracks 81, the outer tracks 81 are able to guide the inner tracks 82 and the frame 4 to slide relative to the stand 3 along the first direction X1 or along an opposite direction, i.e. a second direction X2. Amounts of the outer track 81 and the inner track 82 of the sliding mechanism 8 of the present invention are not limited to those illustrated in figures in this embodiment. The sliding mechanism 8 can include only one pair of the outer track 81 and the inner track 82 as well.

In addition, the two first mechanisms 5 are both disposed on the first side 31 of the stand 3, adjacent to the third side 33 and the fourth side 34, respectively. Furthermore, each of the first mechanisms 5 includes a roller member 51 and a first resilient member 52. The roller member 51 is rotably disposed on the stand 3, and the first resilient member 52 sleeves on the roller member 51. The first resilient member 52 is further connected to the frame 4.

In this embodiment, the first resilient member 52 is a constant force spring. It should be noticed that the roller member 51 can include a rolling body 511 and a shaft 512. The rolling body 511 is used for rolling and winding up the first resilient member 52. The shaft 512 protrudes from the rolling body 511 and is pivoted to the plate 35 of the stand 3. As shown in FIG. 3 to FIG. 5, the shaft 512 is substantially parallel to a normal N of the plate 35, i.e. a direction in thickness of the plate 35. In other words, the shaft 512 is pivoted to the stand plate 35 along a direction parallel to the normal N of the plate 35 of the stand 3. Namely, the rolling body 511 is oriented parallel to the plate 35 of the stand 3. Thus, a width of the first resilient member 52 can be effectively reduced, for facilitating development of the holding device 1000 with thin thickness.

As shown in FIG. 3 to FIG. 5, the second mechanisms 6 are both installed on the second side 32 of the stand 3, adjacent to the third side 33 and the fourth side 34, respectively. Furthermore, each of the second mechanisms 6 includes a housing member 61, a second resilient member 62 and an engaging member 63. The housing member 61 is slidably installed on the stand 3. The second resilient member 62 is disposed inside the housing member 61. The engaging member 63 is connected to the second resilient member 62. In this embodiment, the housing member 61 can include a button portion 611, and a through hole 36 corresponding to the button portion 611 is formed on the stand 3, such that the button portion 611 is slidably disposed within the through hole 36 and protrudes from an opposite side of the stand 3 relative to the housing member 61, as shown in FIG. 5. The through hole 36 is a long-stripped hole and extends along a direction substantially perpendicular to the first direction X1, and a cross section area of the through hole 36 is greater than a cross section area of the button portion 611. When the button portion 611 is pushed to drive the housing member 61 to slide, the through hole 36 is able to guide the button portion 611, namely the housing member 61, to slide relative to the stand 3 in the third direction X3 or in the fourth direction X4.

As shown in FIG. 3 to FIG. 5, the frame 4 has two engaging portions 41 for selectively engaging with the corresponding engaging member 63 of the second mechanism 6, respectively, such that the second mechanism 6 is in an engaged status. Alternatively, the engaging member 63 is able to be driven by the housing member 61 to depart from the engaging portion 41, such that the second mechanism 6 is in a released status. Each of the latch mechanism 7 is installed on the stand 3, near the corresponding second mechanism 6. Furthermore, each of the latch mechanism 7 includes a latching member 71 and a driving member 72. The latching member 71 is movably installed on the stand 3 and near the housing member 61 of the second mechanism 6. The driving member 72 abuts against the latching member 71 and the stand 3. The driving member 72 can drive the latching member 71 to latch the housing member 61. In this embodiment, a first latching portion 612 is formed on the housing member 61, and the latching member 71 has a second latching portion 711. The second latching portion 711 is used for latching the first latching portion 612, such that the latching member 71 of the latch mechanism 7 latches the housing member 61 of the second mechanism 6. Moreover, the first latching portion 612 is a slot, and the second latching portion 711 is a protrusion. In addition, the frame 4 can further have two pushing portions 42 corresponding to the latching members 71, respectively. The pushing portion 42 is able to move with the frame 4, so as to selectively bring the second latching portion 711 the latching member 71 to separate from the first latching portion 612 of the housing member 61. The operating principle will be provided later. It should be noticed that the amounts of the engaging portion 41 of the frame 4 and the latch mechanism 7 correspond the amount of the second mechanism 6, and the above amounts are not limited to those illustrated in figures in this embodiment.

Figure 6:
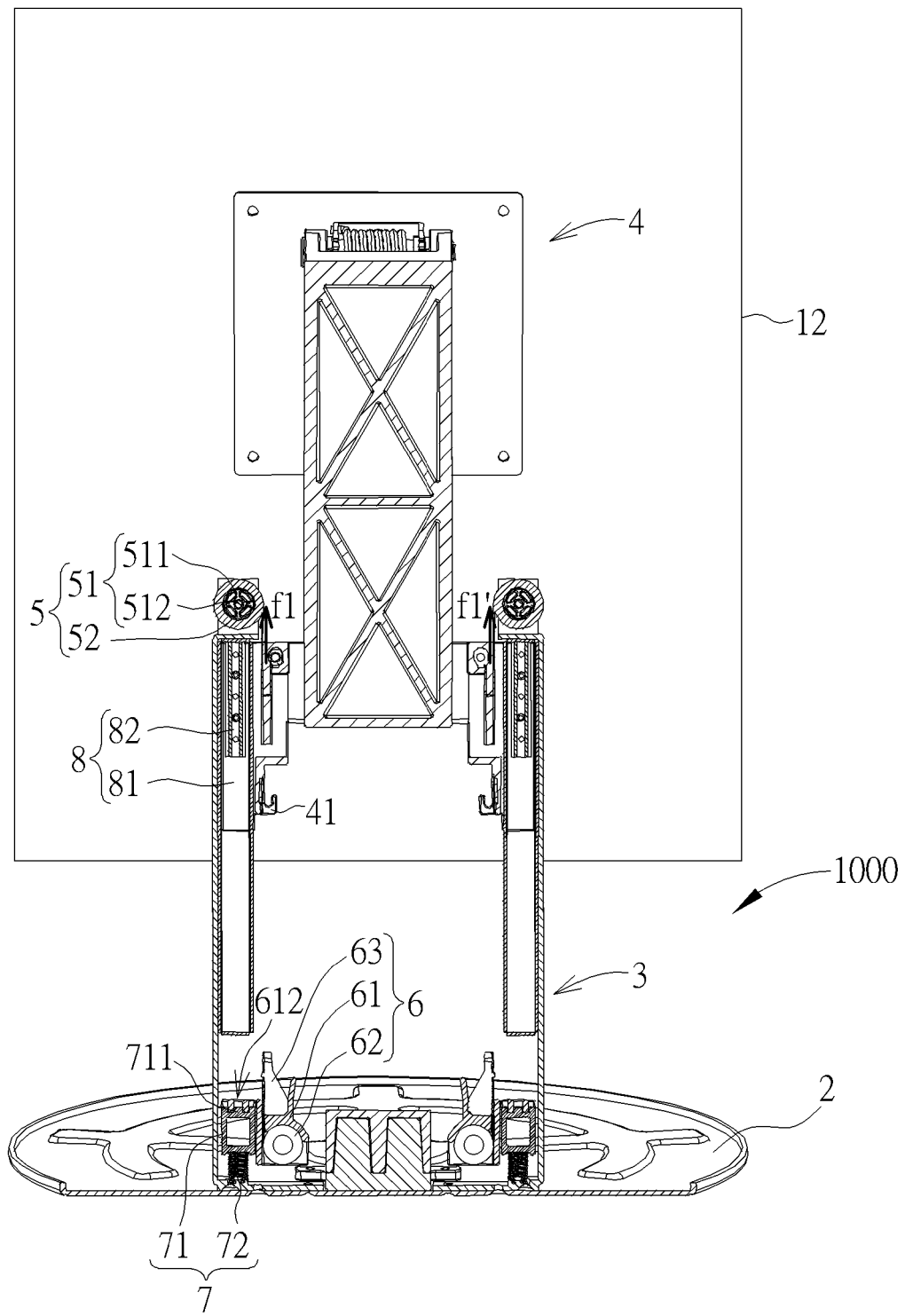
FIG. 6 is a sectional diagram of the holding device according to the embodiment of the present invention.

The operating principle of the holding device 1000 is provided as follows. Please refer to FIG. 5 and FIG. 6. When the frame 4 holding a first electronic device 12 with a weight W1, the first resilient member 52 of the first mechanism 5 provides the frame 4 with a first force (i.e. a resultant of forces f1 and f1' shown in FIG. 6). For simplicity, an angle between the plate 35 of the stand 3 and the base 2 is supposed to be 90 degrees. As shown in FIG. 6, the weight W1 of the first electronic device 12, the weight of the frame 4 and the first force (i.e. f1+f1') provided by the first resilient member 52 satisfy the following formula, wherein the friction therebetween is neglected:

$$W1+\text{the weight of the frame } 4 = f1+f1' \quad (1)$$

In such a manner, the above-mentioned quantity is in equilibrium for allowing the frame 4 to instantly stop in any desired height relative to the supporting surface 2000. In fact, an acute angle is included between the base 2 and the stand 3 in this embodiment. Therefore, the formula (1) can be further revised based on trigonometric function theory. The derivation thereof is known to those in the art, and related description is omitted herein.

Figure 10:
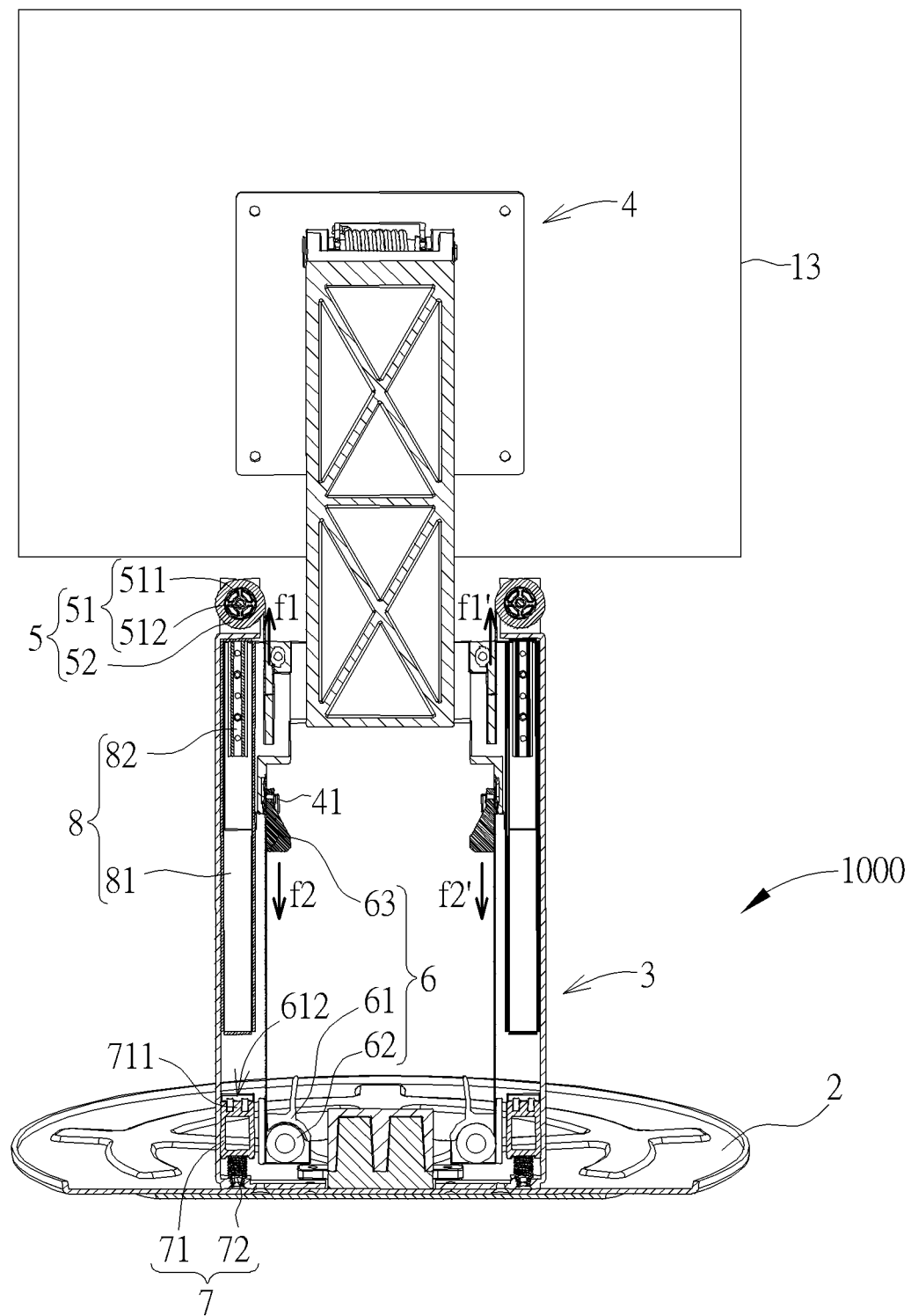
FIG. 10 is a sectional diagram of the holding device in FIG. 9.

On the other hand, when the holding device 1000 is utilized for holding a second electronic device 13, shown in FIG. 10, with a smaller weight than the weight of the first electronic device 12, the above-mentioned quantity will not be in equilibrium. Thus, an adjustment process as illustrated below is needed.

Figure 7:
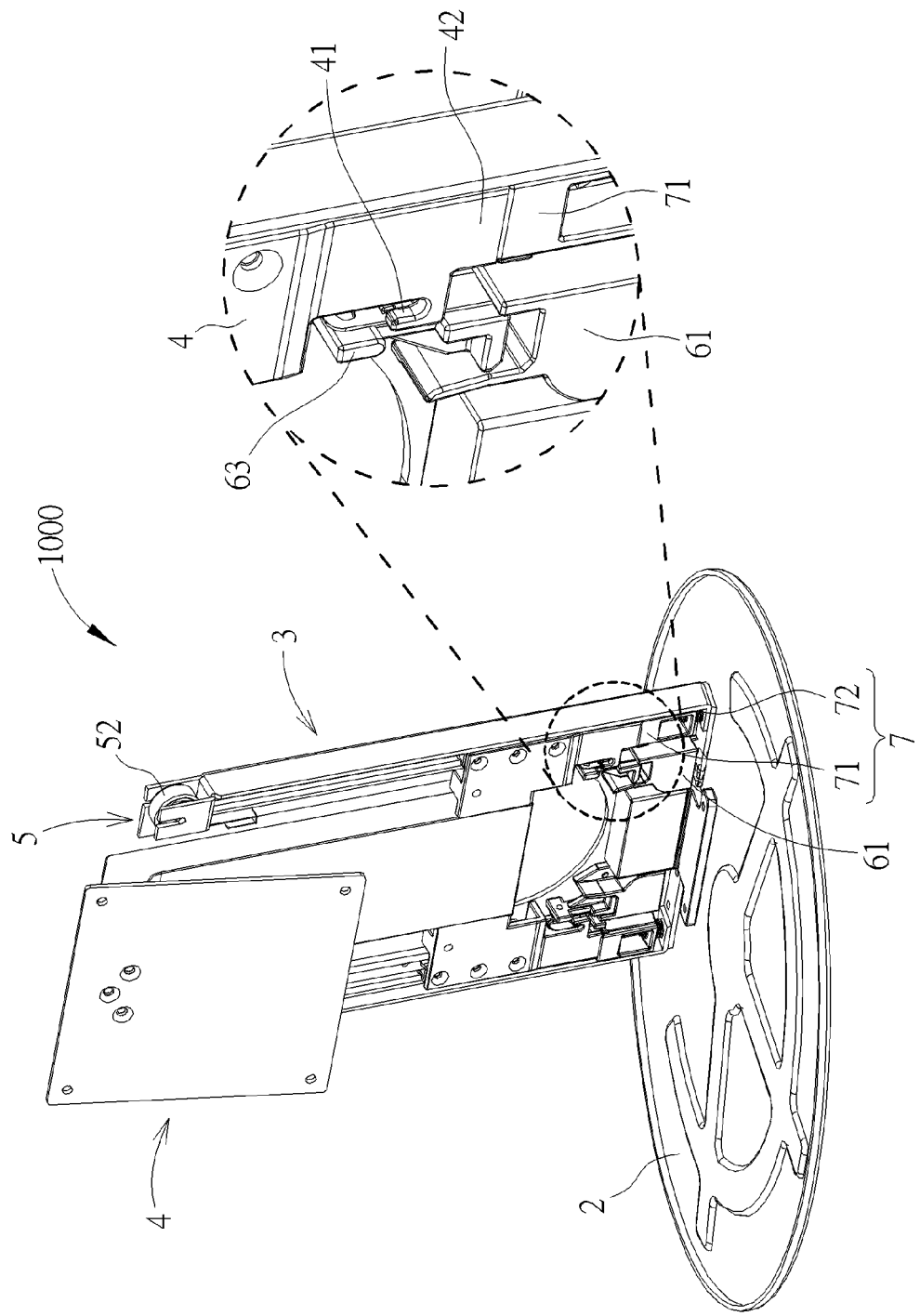
FIG. 7 is a diagram illustrating that a frame is in a low position and a second mechanism is in a released status according to the embodiment of the present invention.
Figure 8:
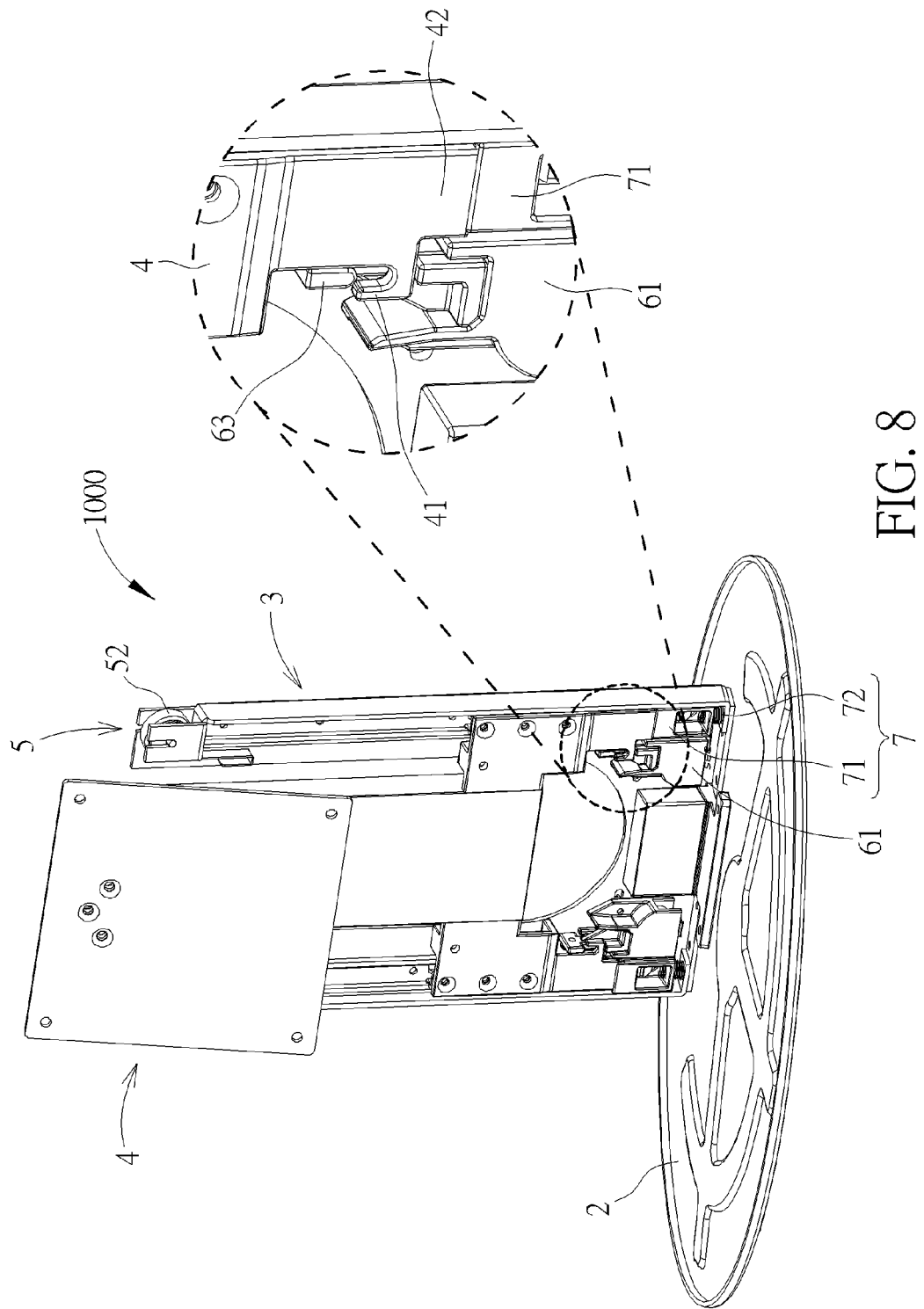
FIG. 8 is a diagram illustrating that the frame is in the low position and the second mechanism is in an engaging status according to the embodiment of the present invention.
Figure 9:
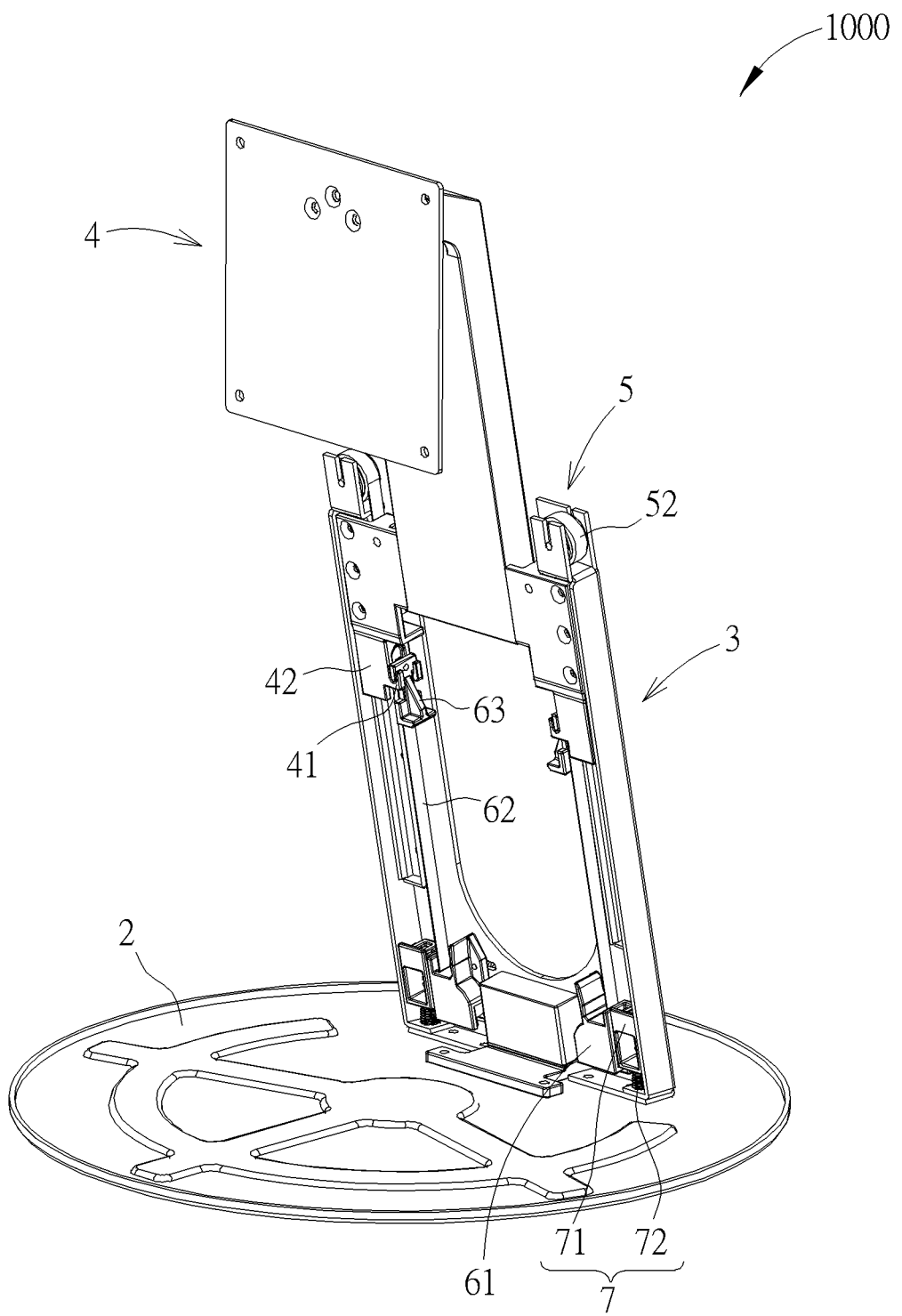
FIG. 9 is a diagram illustrating that the frame is in a high position and the second mechanism is in the engaging status according to the embodiment of the present invention.

First, the frame 4 is slid relative to the stand 3 in the second direction X2 to a low position as shown in FIG. 7. Meanwhile, the pushing portion 42 of the frame 4 activates the latching member 71 from a position shown in FIG. 7 to a position shown in FIG. 8, so as to separate the latching member 71 from the housing member 61 of the second mechanism 6. Furthermore, after the latching member 71 does not latch the housing member 61, the button portion 611 of the housing member 61 is pushed to move the housing member 61 toward outside of the stand 3, i.e. as shown in FIG. 5, the housing members 61 respectively move in the third direction X3 and in the fourth direction X4. In such a manner, the housing member 61 brings the engaging member 63 to the position shown in FIG. 8, such that the engaging member 63 engages with the engaging portion 41 of the frame 4. In other words, when the frame 4 slides to the low position shown in FIG. 7 along the second direction X2, the engaging member 63 of the second mechanism 6 engages with the engaging portion 41 of the frame 4, so as to make the second mechanism 6 be in an engaging status. Accordingly, the second resilient member 62 of the second mechanism 6 is connected to the frame 4 and provides the frame 4 with a second force (i.e. a resultant of forces f2 and f2' as shown in FIG. 10).

Under this situation, the weight of the second electronic device 13 (W2), the weight of the frame 4 and the second force (i.e. f2+f2') provided by the second resilient member 62 satisfy the following formula, wherein the friction therebetween is neglected:

$$W2+\text{the weight of the frame } 4 = f1+f1'-f2-f2' \quad (2)$$

In such a manner, the weight of the second electronic device 13 W2, the weight of the frame 4, the first force and the second force are in equilibrium for allowing the frame 4 to instantly stop in any desired height relative to the supporting surface 2000.

In summary, the present invention utilizes the first resilient member 52 and the second resilient member 62 for providing forces applied in opposite directions, i.e. a concept of subtraction of the forces, so as to enable the holding device 1000 to hold electronic devices with different weights. Furthermore, a value of the subtraction of the forces can be covered by design of width and modulus elasticity of the constant force springs. In addition, since the first resilient member 52 and the second resilient member 62 apply forces in opposite ways, the frame 4 will not deviate during sliding process. It should be noticed that the present invention adopts two constant force springs disposed on the opposite sides of the stand 3, but the present invention is not limited thereto. For example, the first mechanism 5 and the second mechanism 6 can be a spring as well. As for which one of the aforesaid designs is adopted, it depends on practical demands.

Compared to the prior art, the two mechanisms (the constant force spring) of the present invention are disposed on the two opposite sides of the stand and are able to provide the frame with forces applied in opposite directions. The frame of the present invention is able to be selectively connected to the mechanism (the constant force spring) with smaller force. When the holding device is for holding the electronic device with more weight, the frame is not connected to the mechanism with smaller force. As a result, the mechanism (the constant force spring) with larger force is capable of providing enough force for lifting the electronic device with more weight. On the other hand, when the holding device is for holding the electronic device with less weight, the frame is connected to the mechanism with smaller force. The force provided by the mechanism with smaller force is opposite to the force provided by the mechanism with larger force. As a result, the force provided by the mechanism with smaller force eliminates part of the force provided by the mechanism with larger force. In such a manner, the holding device is capable of lifting the electronic device with less weight. In addition, the two mechanisms of the present invention are disposed on the two opposite sides of the stand for reducing an amount of component on one single side. It reduces overall thickness of the holding device and advantages development of the holding device with thin thickness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An adjustable holding device, comprising:
a stand;

a frame disposed on the stand and capable of reciprocatingly sliding relative to the stand, and having an engaging portion;

a first mechanism installed on a side of the stand, and comprising a first resilient member connected to the frame and providing the frame with a first force; and a second mechanism installed on another side of the stand and opposite to the first mechanism, and switchable between an engaging status and a released status, comprising:

a second resilient member; and an engaging member connected to the second resilient member, wherein when the second mechanism is in the engaging status and engages with the engaging portion, the second resilient member is connected to the frame for providing the frame with a second force, wherein when the second mechanism is in the released status and separates from the engaging portion, the second resilient member is not connected to the frame and does not provide the frame with the second force, wherein in the released status the frame is in contact with the stand, wherein a direction of the first force is opposite to a direction of the second force.

2. The holding device of claim 1, wherein the second resilient member is a constant force spring, the frame is capable of sliding relative to the stand between a high position and a low position, and the second mechanism further comprises a housing member slidably installed on the stand, wherein the second resilient member is disposed inside the housing member, the housing member is adapted for activating the engaging member to selectively engage with the engaging portion when the frame slides to the low position.

3. The holding device of claim 2, further comprising:

a latch mechanism installed on the stand and near the second mechanism, wherein the latch mechanism latches the housing member when the second mechanism is in the released status.

4. The holding device of claim 3, wherein the latch mechanism comprises:

a latching member movably installed on the stand; and a driving member abutting against the latching member and the stand, wherein the driving member drives the latching member to latch the housing member when the second mechanism is in the released status.

5. The holding device of claim 4, wherein the housing member has a first latching portion, the latching member has a second latching portion for latching the first latching portion, such that the latching member latches the housing member, and the frame further has a pushing portion for pushing the latching member when the frame moves to the low position, so as to separate the second latching portion from the first latching portion.

6. The holding device of claim 2, wherein the housing member has a button portion, a through hole corresponding to the button portion is formed on the stand, wherein the button portion is slidably disposed within the through hole and protrudes from an opposite side of the stand relative to the housing member.

7. The holding device of claim 6, wherein a direction in which the button portion slides is inclined with a direction in which the frame reciprocatingly slides relative to the stand.

8. The holding device of claim 1, further comprising:

a sliding mechanism for sliding the frame relative to the stand, and having:

an outer track fixed on the stand; and an inner track installed on the frame and cooperating with the outer track slidably.

9. The holding device of claim 1, wherein the first mechanism further comprises a roller member rotably disposed on the stand, and the first resilient member is a constant force spring and sleeves on the wheel member.

10. The holding mechanism of claim 9, wherein the stand comprises a plate, and the roller member comprises a rolling body and a shaft protruding from the rolling body and being pivoted to the stand, wherein the shaft is substantially parallel to a normal of the plate.

* * * * *